US006648064B1

(12) United States Patent
Hanson

(10) Patent No.: US 6,648,064 B1
(45) Date of Patent: Nov. 18, 2003

(54) ACTIVE HEAT SINK

(75) Inventor: George E. Hanson, Andover, KS (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/298,338

(22) Filed: Nov. 14, 2002

(51) Int. Cl.$^7$ ................................................ F24H 3/02
(52) U.S. Cl. .................. 165/120; 165/80.4; 165/104.25; 165/104.33; 361/698; 174/15.1
(58) Field of Search ............................. 165/299, 80.4, 165/80.5, 120, 185, 104.22, 104.25, 104.28, 104.34, 104.33; 361/698, 699, 697; 257/714; 174/15.1

(56) References Cited

U.S. PATENT DOCUMENTS

| | | | | |
|---|---|---|---|---|
| 4,087,239 A | * | 5/1978 | Cline et al. ................. | 432/124 |
| 5,316,077 A | * | 5/1994 | Reichard ................ | 165/104.28 |
| 5,731,954 A | * | 3/1998 | Cheon ......................... | 361/699 |
| 6,019,165 A | * | 2/2000 | Batchelder ................. | 165/80.3 |
| 6,021,844 A | * | 2/2000 | Batchelder ................. | 165/80.3 |
| 6,408,937 B1 | * | 6/2002 | Roy ....................... | 165/104.33 |
| 6,529,377 B1 | * | 3/2003 | Nelson et al. .............. | 361/699 |

OTHER PUBLICATIONS

Azar, Kaveh, "Is liquid cooling upon us?", *Electronics Cooling*, vol. 7, No. 3, Aug. 2001, p. 1.
Azar, Kaveh, "The continuing saga of the liquid cooling question," *Electronics Cooling*, vol. 7, no 4, Nov. 2001, p. 1.
Joshi, Yogendra, "Heat out of small packages," *Mechanical Engineering*, Dec. 2001, pp. 56–58.

* cited by examiner

*Primary Examiner*—Terrell McKinnon
(74) *Attorney, Agent, or Firm*—The Law Offices of William W. Cochran, LLC

(57) ABSTRACT

An active heat sink uses a liquid coolant to transfer heat from a hot zone to a cool zone. The liquid coolant is propelled using a motor comprised of a plurality of external coils that are in magnetic communication with a plurality of magnets attached to a pump gear. The motor does not require any penetration of the liquid cavity. Further, the heat pump may have a temperature monitoring circuit to determine whether or not the pump should be activated.

20 Claims, 4 Drawing Sheets

ACTIVE HEAT SINK

BACKGROUND OF THE INVENTION a. Field of the Invention

The present invention pertains to heat sinks and specifically to liquid cooled heat sinks.

b. Description of the Background

Cooling of electronics devices is a critical issue in today's high performance computers. As processor frequencies increase and the pitch sizes decrease, the heat flux of processor chips increase dramatically. Further, the heat distribution across the surface of a processor chip may vary greatly.

Many different heat sinks and heat dissipation methods have been employed. Convection cooled heat sinks or fan-cooled heat sinks have been used with success in various electronic applications. The sizes and cooling air velocities of the heat sinks have increased significantly to meet power dissipation requirements of faster and faster computers. However, further dramatic improvements in cooling efficiency appear unlikely.

Various liquid cooling apparatuses have been contemplated to address the increased heat dissipation requirements. In general, liquid cooling can be used to collect the heat at a heat source such as a processor chip, and transmit the liquid with a pump to a cooling section such as a remotely located radiator. Other designs include passive thermo-siphons and other liquid-cooled designs. Such systems are much more complex than a simple fan-cooled heat sink and have heretofore not come into commercial practice on a large scale.

It would therefore be advantageous to provide an efficient, simple, low cost heat sink that can handle large heat fluxes from electronic components. It would further be advantageous to provide a heat sink that may be adapted to transfer heat from a specific area to another.

SUMMARY OF THE INVENTION

The present invention overcomes the disadvantages and limitations of the prior art by providing a system and method for an active heat sink that mounts to one or more electronic components. The heat sink incorporates a pump that causes a liquid to be propelled across a hot area to heat the liquid, then across a cooler area to transfer heat from the hot area to the cooler area. The heat sink has an integral motor that causes the pump to turn without requiring a shaft to penetrate the liquid cavity. The heat sink may have a temperature monitoring device to turn on and off the pumping system.

The present invention may therefore comprise an active heat sink comprising: a heat transfer fluid; a heat sink body having a circuit for the transmission of the heat transfer fluid, the circuit adapted to flow past a hot zone and past a cool zone, the heat sink body being composed of a non-magnetic material; a cover adapted to encapsulate the heat transfer fluid inside of the circuit; a first pump gear and a second pump gear adapted to be mounted in the heat sink body and further adapted to be mounted inside the circuit to propel the heat transfer fluid about the circuit, at least one of the pump gears having a plurality of magnets disposed about a diameter of the one of the pump gears; a plurality of field coils disposed outside of the circuit and adapted to create a plurality of magnetic fields in the vicinity of the plurality of magnets such that the magnetic fields and the magnets may exert an attractive or a repulsive force; and a controlling circuit adapted to turn on and off the plurality of field coils to create the plurality of magnetic fields in a sequence such that the pump gear is caused to rotate.

The present invention may further comprise a method for cooling an integrated circuit comprising: attaching an active heat sink to the integrated circuit, the active heat sink comprising a heat transfer fluid, a heat sink body having a circuit for the transmission of the heat transfer fluid, the circuit adapted to flow past a hot zone and past a cool zone, the heat sink body being composed of a non-magnetic material, a cover adapted to encapsulate the heat transfer fluid inside of the circuit, a first pump gear and a second pump gear adapted to be mounted in the heat sink body and further adapted to be mounted inside the circuit to propel the heat transfer fluid about the circuit, at least one of the pump gear having a plurality of magnets disposed about a diameter of the pump gear, a plurality of field coils disposed outside of the circuit and adapted to create a plurality of magnetic fields in the vicinity of the plurality of magnets, and a controlling circuit adapted to turn on and off the plurality of field coils; and causing the controller to sequentially turn on and off the field coils such that attractive and repulsive forces are created between the plurality of magnetic fields and the magnets such that the pump gear is caused to rotate and thereby propel the heat transfer fluid about the circuit.

The present invention may further comprise an active heat sink comprising: a heat transfer fluid; a first means for containing the heat transfer fluid such that the heat transfer fluid may flow past a hot zone and past a cool zone, the first means being composed of a non-magnetic material; a second means for pumping the heat transfer fluid within the first means, the second means comprising a plurality of magnets mounted to at least one gear and disposed within the first means and a plurality of coils outside of the first means; and a third means for controlling the coils such that the magnets are caused to rotate the at least one gear and cause the heat transfer fluid to be propelled past the hot zone and the cool zone.

The advantages of the present invention are that heat may be transferred throughout a heat sink for more efficient and effective cooling of the heat sink. The heat transfer fluid is fully encapsulated and contained so that potential leak paths are minimized. Further, a gear pump is caused to move without a rotary seal through the fluid cavity to again minimize any leak paths for the fluid. A controller is provided to start and stop operation of the active portion of the heat sink based on the temperature of the heat sink.

DETAILED DESCRIPTION OF THE INVENTION

Figure 1:
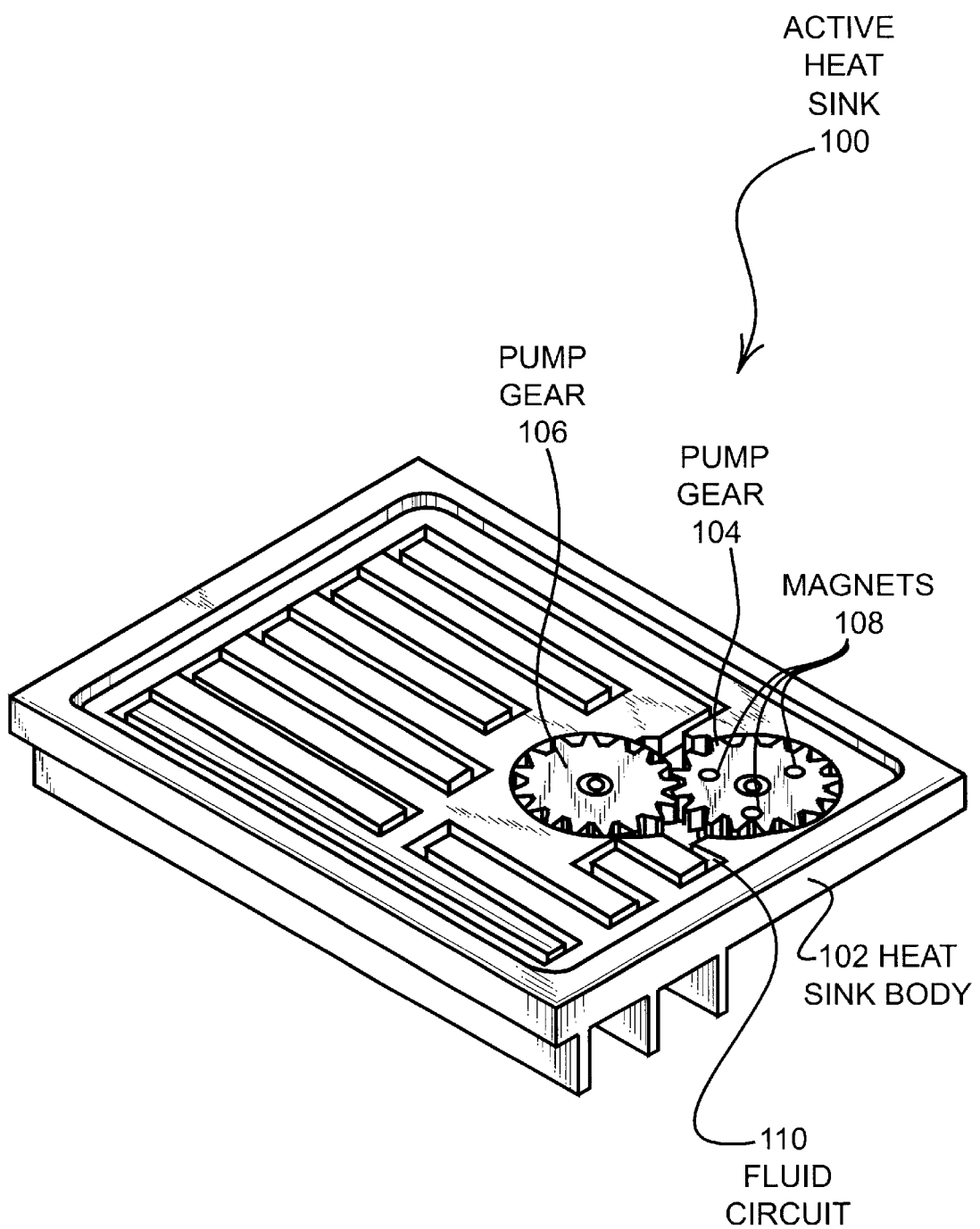
FIG. 1 is an illustration of a perspective view of an embodiment of the present invention of an active heat sink with the cover and poles removed.

FIG. 1 illustrates a perspective view of an embodiment 100 of an active heat sink with the cover and poles removed.

A heat sink body 102 has pump gears 104 and 106 installed. Pump gear 104 has magnets 108 pressed into the gear 106. The pump gears 104 and 106 are caused to turn, forcing a cooling fluid to pass along the fluid circuit 110.

The embodiment 100 provides an active mechanism whereby the heat sink body 102 may have efficient heat transfer. This is provided by passing the fluid circuit 110 near an area of high heat, heating the fluid, then passing the fluid past an area of low temperature. The process creates a more uniform temperature across the entire heat sink body 102, which in turn allows more efficient convective heat transfer from the heat sink body 102.

For example, integrated circuits for computers often have very high heat fluxes in very small areas of the integrated circuit. When a conventional heat sink is applied to the integrated circuit, the heat sink functions by conducting the heat throughout the mass of the heat sink, then convecting the heat through the surface of the heat sink to the surrounding air. Often, a fan may be used to assist in moving air across the surface of the heat sink. Heat sinks are most efficient when they are isothermal. Thus, the heat sinks are often manufactured from a material with high thermal conductivity such as aluminum.

The present embodiment assists in transferring the heat throughout the heat sink body 102 to bring the heat sink body 102 closer to an isothermal condition, thus raising the efficiency of the heat transfer process. Further, the fluid circuit 110 may be adapted to collect the heat in a specific area and disperse the heat to a cooler area. Those skilled in the art may create various fluid circuits adapted to the specific heat transfer needs of different applications while maintaining within the spirit and intent of the present invention.

The heat sink body 102 may be preferably manufactured from aluminum. In other embodiments, the heat sink body 102 may be of another material, such as magnesium, copper, silver, or other material. However, the material would likely be a material with high thermal conductivity. In the particular invention, the heat sink body 102 would also preferably be a non-ferromagnetic material.

The magnets 108 are used in conjunction with a series of external magnetic fields to form a motor. By creating and controlling a series of magnetic fields, the gear 104 may be caused to turn and thus pump the heat transfer fluid throughout the fluid circuit 110.

Any number of magnets 108 may be used. In an embodiment with only one magnet, those skilled in the art would appreciate that the gear 104 may need to be analyzed so that the weight of the magnet 108 does not unbalance the rotation of the gear 104. In general, designers may typically use two or more magnets.

The magnets 108 may be installed about a specific diameter of the gear 104. In some embodiments, the magnets may be evenly spaced about the diameter. In the present embodiment, the magnets 108 are placed at 120 degree increments on a specific diameter. In other embodiments, those skilled in the art would appreciate that the magnets 108 may be placed at other intervals, such as three magnets placed with separations of 160, 160, and 40 degrees.

The gears 104 and 106 form a pump by which the fluid is caused to move. If one of the gears is caused to move, the second gear is driven. In some embodiments, both gears may be forced to move. In such cases, both gears may be outfitted with a set of magnets. The gears 104 and 106 are preferentially manufactured of a non-ferromagnetic material such as aluminum or various plastic materials. Other materials may also be used.

A cover, not shown, may be sealed to the heat sink body 102 to encapsulate the fluid circuit 110. The seal of the cover may prevent any fluid from leaking out of the circuit 110 and thus causing problems such as contamination or fluid damage to other components, not to mention the loss of performance of the present invention.

The present embodiment has only one seal at the interface of the cover and the heat sink body 102. Because only one seal exists, the likelihood of leaks is minimized. In the prior art of liquid cooled systems, many connections and seals were typically required at the interface between various components. The present invention eliminates almost all of the connections and seals by containing the fluid passages within two components. In general, the present embodiment does not involve high fluid pressures. There may be some expansion of the fluid as the temperature rises. However, the thermal expansion of the heat sink material may compensate for the thermal expansion of the fluid.

The present invention further does not require a phase change of the heat transfer fluid. It is preferred that the fluid is maintained as a fluid and does not change to a gas at any point. In some embodiments, a small bubble of air may be present. In other embodiments, a reservoir of fluid may be constructed in the fluid circuit 110. Such a reservoir may contain an air bubble to compensate for thermal expansion of the fluid.

Figure 2:
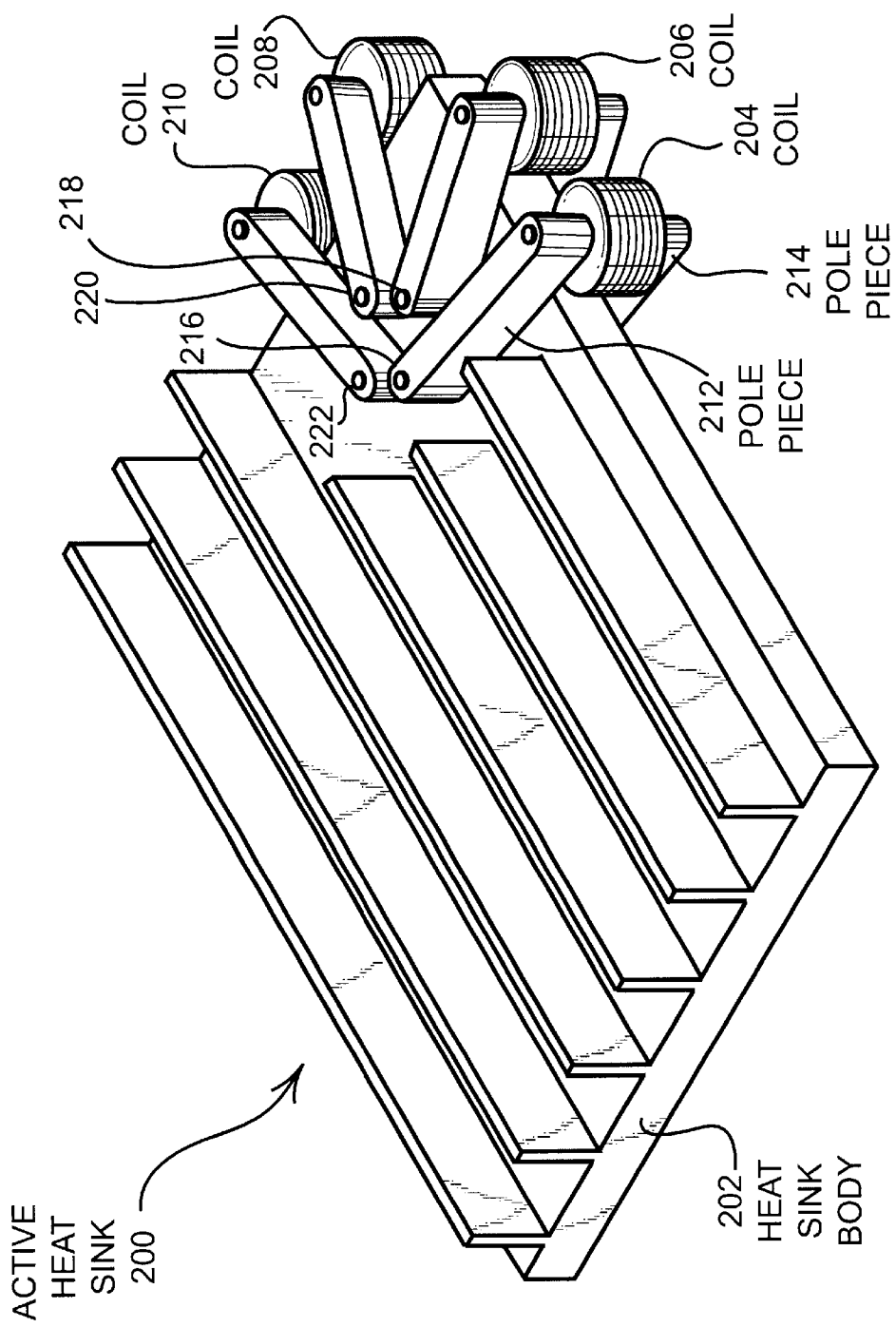
FIG. 2 is an illustration of an embodiment of the present invention shown in a perspective view from the top.

FIG. 2 illustrates an embodiment 200 of the present invention shown in a perspective view from the top. A heat sink body 202 is shown. Electric coils 204, 206, 208, and 210 are also shown. The electric coil 204 has pole pieces 212 and 214 that conduct the magnetic flux generated by the coil 204 to a point 216. Similarly, coils 206, 208, and 210 cause magnetic flux at points 218, 220, and 224, respectively.

The various pole pieces conduct magnetic flux to a point in the vicinity of the gear in which the magnets are placed as shown in FIG. 1. In a preferred embodiment, the points 216, 218, 220, and 222 are arranged in approximately the same diameter as that of the magnets 108 of FIG. 1. The coils 204, 206, 208, and 210 may be caused to create magnetic fields in the vicinity of magnets 108, creating a magnetic attraction or repulsive force for the various magnets and fields. It is known in the art to control the direction and sequence of the magnetic fields to cause the gear with the embedded magnets to turn. By controlling the speed of the sequence, the speed of the gear is controlled.

The four magnetic fields generated by the four coils, when used in conjunction with the three magnets embedded in the gear 104 of FIG. 1, create a situation whereby the gear 104 may be caused to start to move in the appropriate direction. The geometry of the magnetic fields and the magnets are such that when the sequence is started, at least one of the magnets is not located directly underneath one of the magnetic fields. This geometry, in conjunction with the sequencing of the magnetic fields, prohibits the gear from 'locking up' or stalling during start up.

In other embodiments, various positions of the magnets and magnetic fields may be chosen to prevent stalling during start up. For example, those skilled in the art would appreciate that if the magnetic fields or the magnets were spaced unequally about the diameter a lockup potential may not exist. In other embodiments, the four magnets may be placed in the gear and three external coils may be used.

Many different combinations of permanent magnets and external poles may be used to construct various embodiments of the present invention. For example, two, three, four, five, or more magnets may be embedded in the gear with two, three, or more poles causing the gear to rotate. Considerations such as the geometry of the gears and magnets, or the available space for placing the poles, may dictate the design of various embodiments. Those skilled in the art may envision many different magnet and pole combinations while keeping within the spirit and intent of the present invention.

The gears are sealed within the heat sink body and are caused to move with the externally applied magnetic fields. The magnetic fields must permeate the heat sink body and thus the heat sink body is generally constructed of non-ferromagnetic material. This construction has the advantage that the gears may be caused to move while keeping the gears in a sealed environment.

The gears may be mounted on a shaft inside the fluid cavity. In some embodiments, the gears may be mounted on a bearing system comprising a ball bearing or a sleeve bearing. In other embodiments, the material of the gear itself may be chosen to be an effective bearing surface. In still other embodiments, the gears may be trapped between the cover and the heat sink body by a conical shaped protuberance on each of the cover and the heat sink body. Various bearing systems may be used while keeping within the spirit and intent of the present invention.

Figure 3:
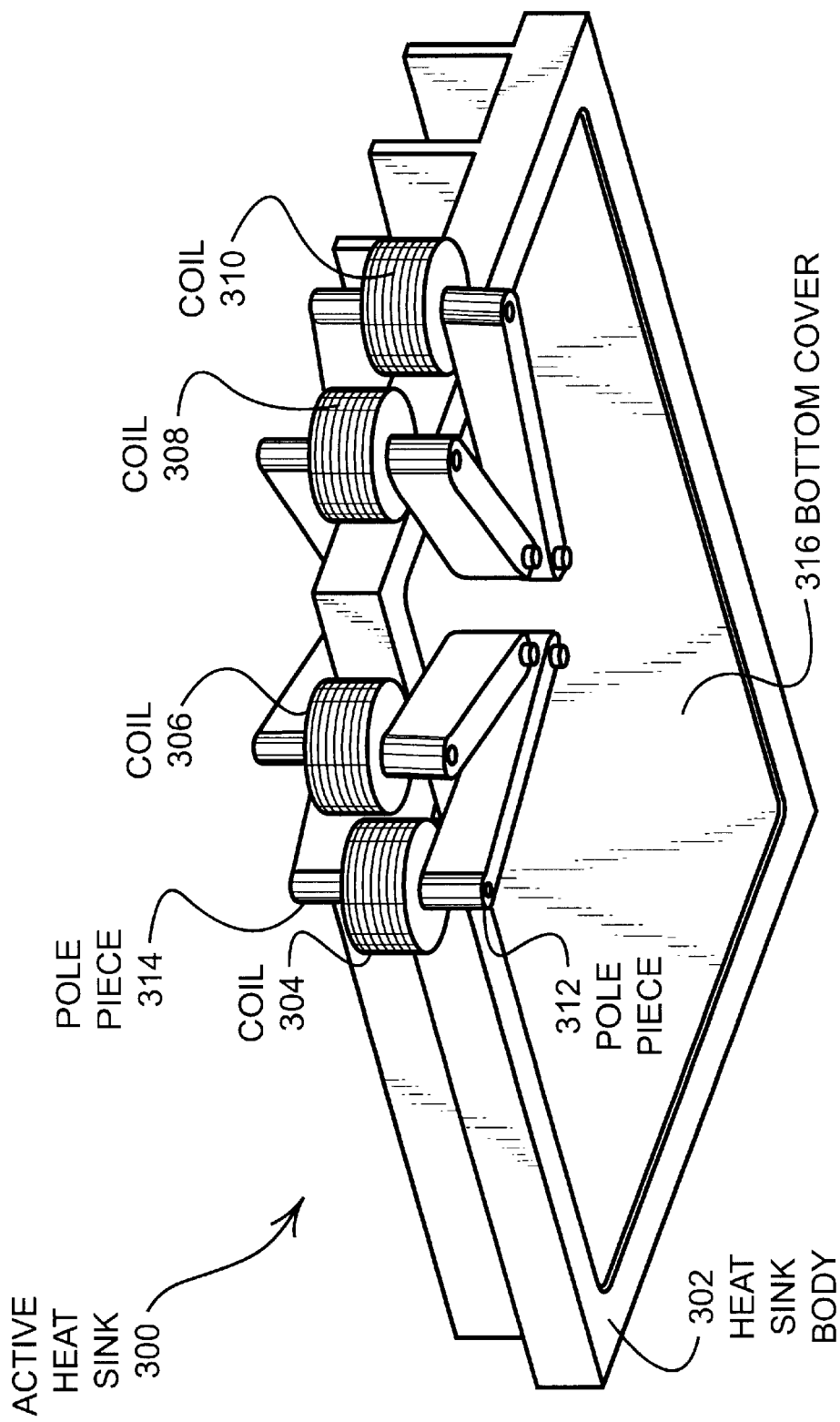
FIG. 3 is an illustration of a perspective view of an embodiment of the present invention shown from the bottom.

FIG. 3 illustrates a perspective view of an embodiment 300 of the present invention shown from the bottom. The heat sink body 302 has coils 304, 306, 308, and 310. Pole pieces 312 and 314 communicate the magnetic flux from the coil 304 to a point in proximity to the magnets arrayed on one of the gears of the pump.

The cover 316 may be placed in contact with a heat source, such as an integrated circuit chip. In some cases, a thermally conductive pad or thermally conductive adhesive may be used to assist in the transmission of heat from the hot integrated circuit to the heat sink 300.

Some embodiments of the present invention may be mounted to one integrated circuits or a plurality of integrated circuits. The integrated circuits may be any conventional packages. In some cases, special recessed forms may be created in the cover 316 to receive the integrated circuits. In such cases, the cover 316 may conduct heat from the top surface of the integrated circuit package but also from one or more sides of the package. In cases where the heat sink 300 is attached to more than one integrated circuit, the cover 316 may be adapted to conform to the various integrated circuits.

The coils 304, 306, 308, and 310 may have coil wires that are connected to the printed circuit board on which the integrated circuit is mounted. The associated control circuitry for the heat sink 300 may be attached to the printed circuit board on which the integrated circuit is mounted, or may be mounted on a separate package and mounted directly to the heat sink 300.

Figure 4:
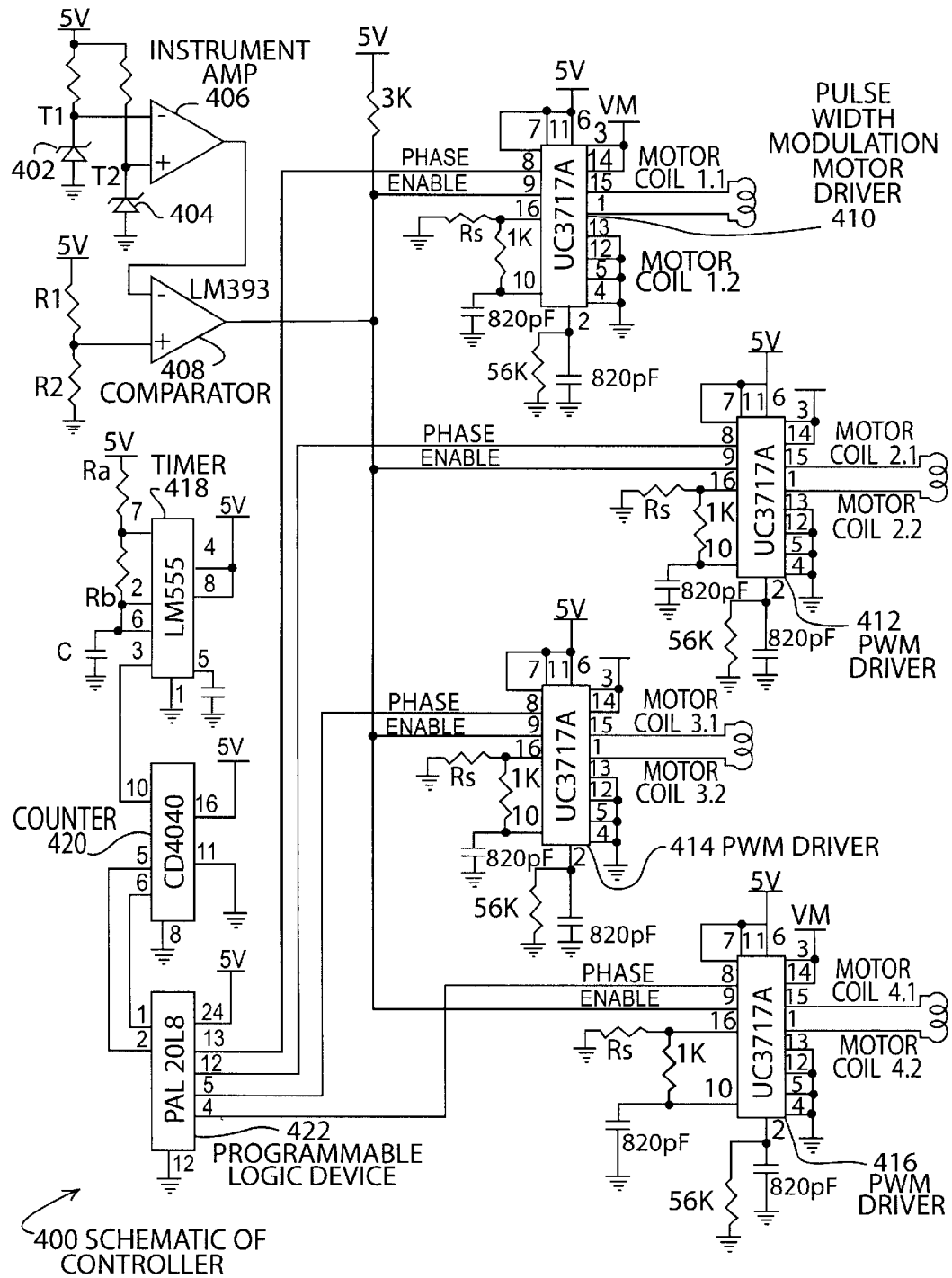
FIG. 4 is an illustration of a schematic diagram of a control circuit for an embodiment of the present invention.

FIG. 4 illustrates a schematic diagram of a control circuit 400 for an embodiment of the present invention. Thermistors 402 and 404 are compared with an amplifier 406 and fed into a comparator 408. The output of the comparator 408 is used to enable the motor drivers 410, 412, 414, and 416. Each motor driver controls one of the coils of the motor. A timer 418 feeds a counter 420 that in turn feeds a programmable logic device 422 that turns on and off the drivers 410, 412, 414, and 416 in sequence.

The thermistors 402 and 404 are used to compare two temperatures on the heat sink. If the two temperatures are substantially different, the heat sink motor is activated. The two thermistors 402 and 404 may be located at a hot zone and a cold zone of the heat sink. In such a position, the thermistors may indicate that the heat transfer of the fluid would bring the heat sink to a more isothermal condition. When the two thermistors are close in temperature, the motor may not be needed and thus is disabled. In some cases, one thermistor may be located in an ambient location and one may be located on the heat sink. Those skilled in the arts may place the thermistors in various locations to detect various conditions for enabling or disabling the motor operation.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An active heat sink comprising:
   a heat transfer fluid;
   a heat sink body having a circuit for the transmission of said heat transfer fluid, said circuit adapted to flow past a hot zone and past a cool zone, said heat sink body being composed of a non-magnetic material;
   a cover adapted to encapsulate said heat transfer fluid inside of said circuit;
   a first pump gear and a second pump gear adapted to be mounted in said heat sink body and further adapted to be mounted inside said circuit to propel said heat transfer fluid about said circuit, at least one of said pump gear having a plurality of magnets disposed about a diameter of said one of said pump gears;
   a plurality of field coils disposed outside of said circuit and adapted to create a plurality of magnetic fields in the vicinity of said plurality of magnets such that said magnetic fields and said magnets may exert an attractive or a repulsive force; and
   a controlling circuit adapted to turn on and off said plurality of field coils to create said plurality of magnetic fields in a sequence such that said pump gear is caused to rotate.

2. The active heat sink of claim 1 wherein said controlling circuit comprises at least one temperature sensor used at least in part to begin and end the operation of said heat sink.

3. The active heat sink of claim 1 wherein said heat sink body is composed of aluminum.

4. The active heat sink of claim 1 wherein the number of said field coils is one more than the number of said magnets.

5. The active heat sink of claim 1 wherein the number of said filed coils is one less than the number of said magnets.

6. The active heat sink of claim 1 wherein said controlling circuit is further adapted to reverse the polarity of said field coils.

7. The active heat sink of claim 1 wherein at least one of said pump gears is mounted on a ball bearing.

8. The active heat sink of claim 1 wherein at least one of said pump gears is mounted on a sleeve bearing.

9. The active heat sink of claim 1 adapted to be mounted on the surface of at least one integrated circuit.

10. The active heat sink of claim 9 wherein said heat sink body has a plurality of fins.

11. The active heat sink of claim 10 wherein a fan is adapted to propel air over at least a portion of the surface of said fins.

12. A method for cooling an integrated circuit comprising:

providing a heat sink body having a circuit for the transmission of a heat transfer fluid, said circuit adapted to flow past a hot zone and a cool zone, said heat sink body being composed of a non-magnetic material;

providing said heat transfer fluid within said circuit;

providing a first pump gear and a second pump gear adapted to be mounted in said heat sink body and further adapted to be mounted inside said circuit to propel said heat transfer fluid about said circuit, at least one of said pump gears having a plurality of magnets disposed about a diameter of said pump gear;

providing a plurality of field coils disposed outside of said circuit and adapted to create a plurality of magnetic fields in the vicinity of said plurality of magnets;

providing a controlling circuit adapted to turn on and off said plurality of field coils at predetermined times;

providing a cover for said circuit adapted to entrap said heat transfer fluid and said gears;

attaching said cover to a integrated circuit to be cooled; and causing said controller to sequentially turn on and off said field coils such that attractive and repulsive forces are created between said plurality of magnetic fields and said magnets such that said pump gear is caused to rotate and thereby propel said heat transfer fluid about said circuit whereby the heat from said hot zone is transferred to said cool zone.

13. The method of claim 12 wherein said step of attaching said active heat sink to said integrated circuit comprises placing a thermally transmissive material between said integrated circuit and said active heat sink.

14. The method of claim 12 further comprising:

providing at least one fan;

providing a plurality of fins attached to said heat sink body; and causing said fan to propel air across at least a portion of said fins.

15. The method of claim 12 further comprising:

detecting at least one temperature with at least one temperature sensor; and causing said controller to begin or end operation based in part on said at least one temperature.

16. The method of claim 12 wherein said heat sink body is composed of aluminum.

17. The method of claim 12 wherein the number of said field coils is one more than the number of said magnets.

18. The method of claim 12 wherein the number of said filed coils is one less than the number of said magnets.

19. The method of claim 12 wherein said controlling circuit is further adapted to reverse the polarity of said field coils.

20. An active heat sink comprising:

a heat transfer fluid;

a first means for containing said heat transfer fluid such that said heat transfer fluid may flow past a hot zone and past a cool zone, said first means being composed of a non-magnetic material;

a second means for pumping said heat transfer fluid within said first means, said second means comprising a plurality of magnets mounted to at least one gear and disposed within said first means and a plurality of coils outside of said first means; and a third means for controlling said coils such that said magnets are caused to rotate said at least one gear and cause said heat transfer fluid to be propelled past said hot zone and said cool zone.

\* \* \* \* \*